United States Patent [19]
Cucchi et al.

[11] Patent Number: 5,329,534
[45] Date of Patent: Jul. 12, 1994

[54] "SYSTEM, DEVICES AND ALGORITHMS FOR THE ERROR CORRECTION IN DIGITAL TRANSMISSION"

[75] Inventors: Silvio Cucchi, Gaggiano; Giorgio Parladori, Verona; Paolo Zapparoli, Varese, all of Italy

[73] Assignee: Alcatel Italia S.p.A., Milan, Italy

[21] Appl. No.: 654,272

[22] Filed: Feb. 12, 1991

[30] Foreign Application Priority Data

Feb. 14, 1990 [IT] Italy ................ 19360 A/90

[51] Int. Cl.$^5$ ............................... G06F 11/10
[52] U.S. Cl. .................... 371/37.1; 371/376
[58] Field of Search ............ 371/37.1, 37.4, 37.5, 371/37.6

[56] References Cited

U.S. PATENT DOCUMENTS

| | | | |
|---|---|---|---|
| 4,494,234 | 1/1985 | Patel | 371/37.6 |
| 4,866,716 | 9/1989 | Weng | 371/37.1 |
| 4,868,828 | 9/1989 | Shao et al. | 371/37.5 |
| 4,899,341 | 3/1990 | Tomimitsu | 371/37.6 |
| 4,958,349 | 9/1990 | Tanner et al. | 371/37.1 |
| 5,001,715 | 3/1991 | Weng | 371/37.1 |
| 5,124,992 | 6/1992 | Kamanou et al. | 371/37.1 |
| 5,132,975 | 7/1992 | Avaneas | 371/37.6 |
| 5,216,676 | 6/1993 | Kimura | 371/37.1 |

Primary Examiner—Robert W. Beausoliel, Jr.
Assistant Examiner—Albert Decady
Attorney, Agent, or Firm—Ostrolenk, Faber, Gerb & Soffen

[57] ABSTRACT

A system for error correction in digital transmissions using the so-called Reed Solomon coding/decoding techniques. At the reception side, the received data stream is processed using a new decoding algorithm. Also, with the described decoding algorithm, error correction is implemented using more simplified equipment than that found in other types of conventional error correction systems. The components making up the error correction system of the invention basically consist of: (1) a central timing unit, (2) a preset unit and (3) at least one Reed Solomon coding/decoding circuit operating in accordance with the proposed algorithm.

6 Claims, 2 Drawing Sheets

"SYSTEM, DEVICES AND ALGORITHMS FOR THE ERROR CORRECTION IN DIGITAL TRANSMISSION"

BACKGROUND OF THE INVENTION

1. Field of the Invention

The present invention relates to a system for error correction in digital transmissions, and more specifically, to such a system using the so-called Reed Solomon encoding/decoding techniques.

2. Description of the Prior Art

Error correction coding theory in digital transmissions using the so-called Reed Solomon encoding/decoding techniques is well known in the field. See, e.g., W. W. Peterson and E. J. Weldon Jr., "Error Correcting Codes" 2d Ed., The MIT Press, 1972. Such error correction provides for the protection of a transmitted symbol stream from the errors introduced by the transmission channel. This technique foresees the association of each block of k information symbols, generated by the data source, with n-k redundancy symbols selected according to a relation specified in the following description.

The n symbols obtained in this manner are transmitted by the channel characterized by a certain error probability. On the reception side, using the analysis of received symbols and limited by the code correction capacity, the positions of eventual errors introduced by the channel can be located and the originally transmitted information is reconstructed. Visualizing the concept, FIG. 1 shows a conventional system in which the symbols represent the functional blocks (Bxx) and signals (Sxx), and are as follows:

B11) is a data source SO in the form of symbols having a length of m bit in time-serial succession;

S11) is generated by SO, and is the input signal towards the encoder CODIF that is now divided in blocks of k symbols;

B12) is the encoder CODIF that adds n-k redundancy symbols to each input block;

S12) is the signal generated by the encoder CODIF that is now formed with blocks of n symbols;

B13) is a scheme of the transmission channel CT, whereby the transmitted blocks are submitted to errors with a certain probability;

S13) indicates the received symbols that can be considered as an overlapping of the original transmitted symbols and symbols introduced from the channel CT;

B14) is the block DEC that, executes the analysis of received words and, limited to the correction capacity of the code, establishes the positions and the amplitudes of the errors introduced by the channel CT;

S14) is the signal that indicates the error position;

S15) is on its turn the signal that holds the information related to the error amplitude;

B15) is the function block delay that introduces a suitable delay for allowing the correct synchronization of operations;

S16) is the signal that coincides with the signal S13 suitably delayed;

B16) is the block CORR that reconstructs the original information transmitted according to signals S14, S15;

S17) is the sequence of symbols obtained correcting the errors and coinciding with S12;

B17) is the EXTRACTION block of the useful information.

The applications of this technique allow corrections of up to "t" received wrong symbols in a block of n symbols, where t is equal to: $t=(n-k)/2$ with the preceding definition of parameters. The algorithms used for the association of redundancy symbols to the information symbols in transmission and for decoding the eventual positions of errors in reception are well-known and are described in a general mathematical form in the technical literature.

A brief review of a known application of the Reed Solomon corrections technique should be helpful. Briefly the theoretical basis of this technique applied, e.g., to the case of symbols having a length of m bits, can be described as follows:

Given a generical sequence of L symbols b0, b1, b2, . . . bL−1, it can be associated univocally with a polynomial of degree L−1:

$$b_0 + b_1 x + \ldots + b_{L-1}x^{L-1} = \sum_{j=0}^{L-1} b_j x^j = P(x)$$

Coding

In the coding phase, the Reed Solomon technique foresees the calculation of the polynomial:

$$T(x)=I(x)x^{n-k}+R(x)$$

where I(x) is the polynomial associated to k information symbols and R(x) having a n−k−1 degree is the remainder of the division of $I(x)x^{n-k}$ by g(x); and further being:

$$g(x) = \prod_{j=i}^{i+2t_0-1} (x - \alpha^j)$$

a polynomial of degree $2t_0$ and i a properly selected parameter. It must be remembered that, being the base field of the type GF(2), the sum of two equal symbols belonging to the field is always zero. It follows immediately that the property $P(x^2)=P^2(x)$. The encoder allows to obtain the sequence of symbols representing the remainder R(x) in a relatively simple manner. Therefore, the sequence of n symbols is transmitted representing the whole polynomial T(x) that is the named code word, formed of k symbols emitted by the source SO followed by the n−k redundancy symbols: t, t1, . . . tn−1 that are the coefficients of T(x) (t is transmitted as the last symbol while tn−1 is transmitted as the first symbol), with $t_i=R_i$ for i=0, . . . , n−k+1 and $t_i=I_i$ for i=n−k, . . . , n−k, being respectively Ri and Ii the coefficients of R(x) and I(x).

Decoding

FIG. 2 shows the classic decoding scheme. It is made up of the following functional blocks:

a block B21) carries out the valuation of the syndromes Sj with: j=i, i+1, $2t_0+1-1$, with i being as specified in the definition of the polynomial g(x);

a block B22) applies an algorithm for determining the coefficients of the location polynomial (e.g., the Berlekamp's algorithm);

a block B23) establishes the error positions by the search of zeros of the locator polynomial using the Chien's algorithm;

a block B24) carries out the valuation of the amplitudes of error by means of, e.g., the Forney's algorithm;

the blocks B25) are the ones that insert suitable delays for the correct running of the system.

The resolution equations related to the various indicated algorithms can be found in the previously cited literature of W. W. Peterson and E. J. Weldon Jr., "Error Correcting Codes", 2d. Ed., the MIT Press, 1972.

Regarding the transmission part, the algorithms have a relatively simple circuit implementation; however, as regards the reception part, they are more complex, and their immediate transform in the circuit type can cause unsatisfactory results. Also, the hardware used for the implementation of the traditional algorithms is notoriously complex with great disadvantages in terms of overall dimension, consumptions, costs and performances.

SUMMARY OF THE INVENTION

For obviating the above mentioned drawbacks, the present invention proposes a new decoding algorithm, characterized by notable advantages for the simplicity of the hardware implementation.

To achieve a satisfactorily implementation, it is necessary to rewrite the decoding algorith using equations that, although allowing the exact calculation of the considered magnitudes, can be carried out by means of more simple circuits and by requiring a reduced number of components. A first aim of the invention is, therefore, to supply a system that, by using a critical rewriting of the decoding algorithm, allows a circuit execution having a reduced complexity with consequent advantages in terms of costs, overall dimensions, consumptions and performances.

The algorithm utilized in the invention is defined by the equations (F1), (F2), (F3) and (F4) as set forth herewith.

The system according to the invention is characterized in that, in reception, the correction algorithm of the invention is applied.

Other aims and advantages of the invention shall further appear in the following description and the related claims taken in conjunction with the accompanying drawings.

DETAILED DESCRIPTION OF THE PREFERRED EMBODIMENT

To describe the mathematical formulation of the invention, the following expressions are specified:

$e_j \alpha^i$ general amplitude error $e_i$ in position i;

$S_j = \Sigma e_i j^i$ syndromes.

i=errors

Figure 1:
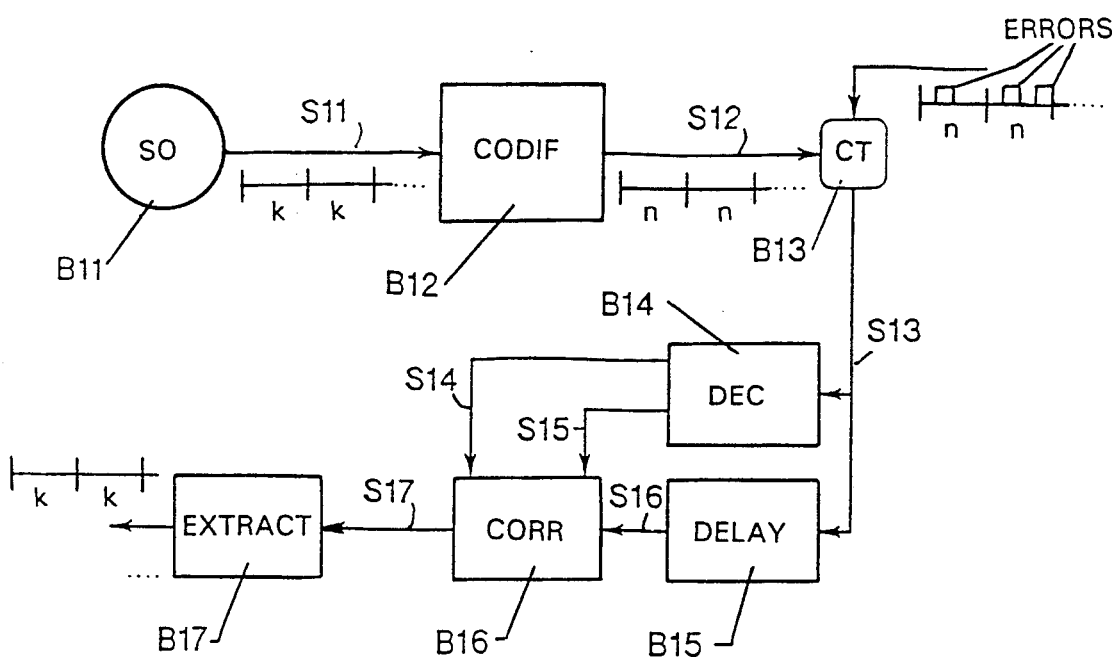
FIG. 1 shows a conventional error correction system.
Figure 2:
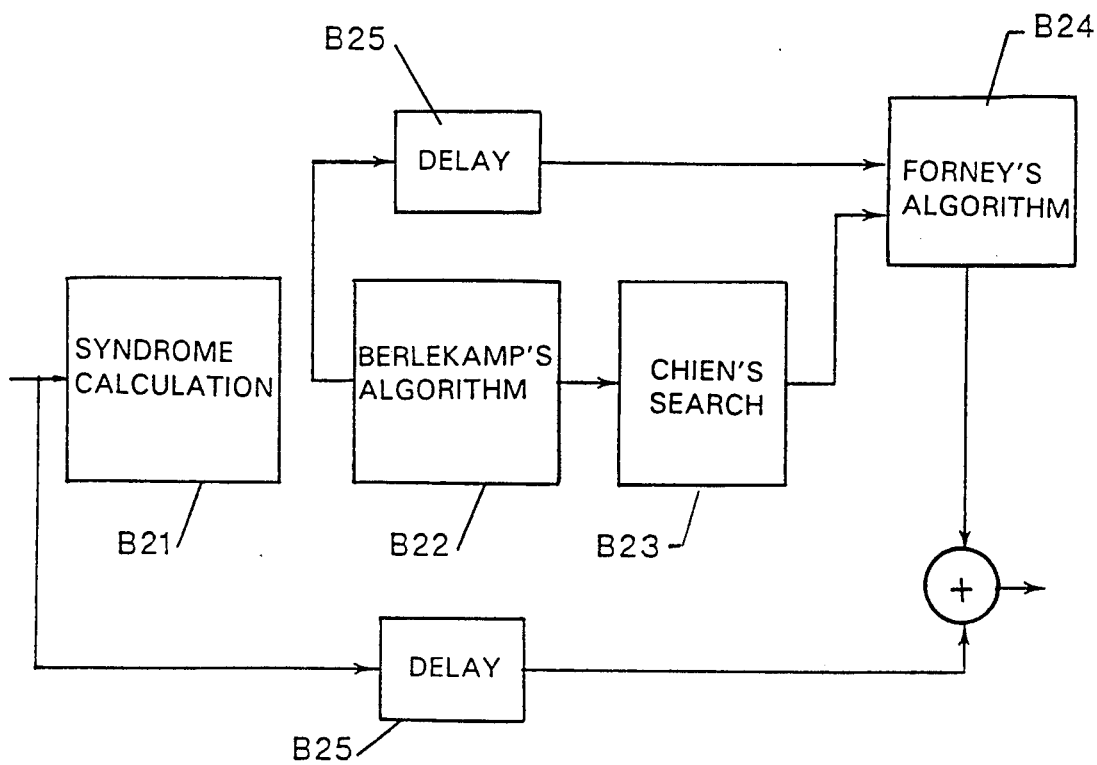
FIG. 2 shows a the classic decoding scheme used in a conventional error correction system.
Figure 3:
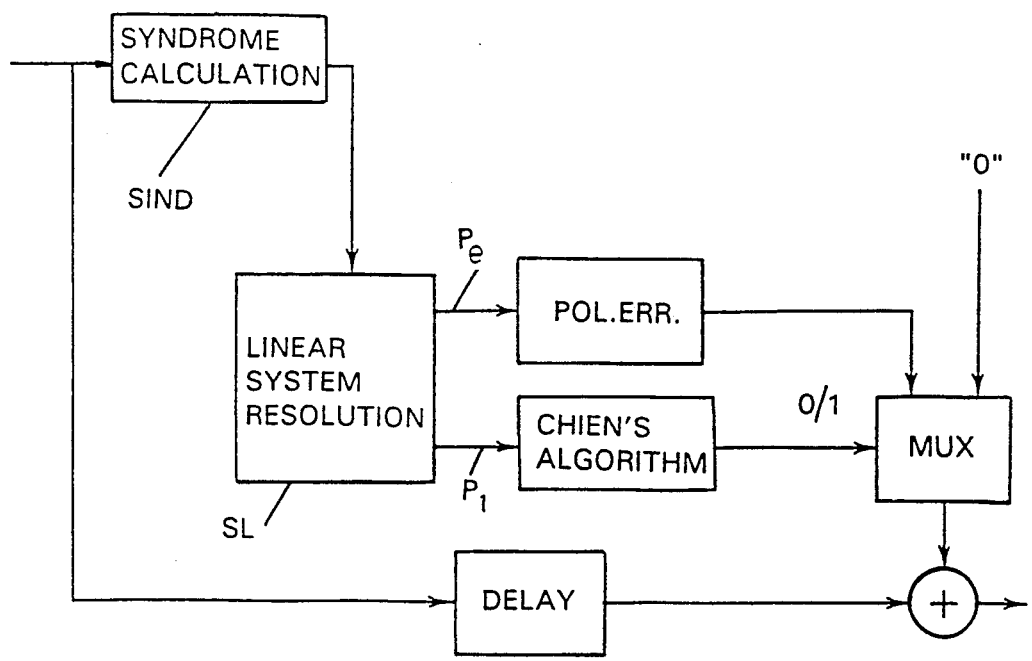
FIG. 3 shows the basis of operation of the decoding algorithm according to the invention.

The decoding algorithm, according to the invention, follows the scheme illustrated in FIG. 3. Similarly, the classic algorithm (e.g. indicated in FIG. 2) held in the functional block SIND, allows the calculation of the syndromes $S_i, \ldots, S_{2t+1}$ (in the following, for simplifying the description, it is assumed that i=1). The block SL establishes (advantageously in parallel processing) the coefficients of two polynomials, the first being the locator polynomial Pi and following the classic theory, while the second Pe is the element characterizing the algorithm of the system according to the invention and supplies, evaluated in the error position, a function of the same error amplitude. According to a first feature of the invention, the error polynomial Pe is defined as follows:

$$P_e(x) = E_0 x^{t_0} + \ldots + E_{t_0-1} x + E_{t_0} = \sum_{i=0}^{t_0} e_i x^{t_0-i} \quad (F1)$$

where Pe $(\alpha^i)$=f(ei), with f(ei) being a suitably selected function. Starting from the definition of the polynomial Pe(x), a set of t equations is constructed in the following manner: the error polynomial is multiplied respectively by $x, x^2, \ldots x^{t_0-1}$ and it is evaluated in the generical position $\alpha^i$. In this manner, the following system of equations SE1 is obtained:

$$\begin{aligned}
\alpha^{t_0 i} + E_1 \alpha^{(t_0-1)i} + \ldots + E_{t_0-1} \alpha^i + E_{t_0} &= f(e_i) \quad \text{(SE1)}\\
\alpha^{(t_0+1)i} + E_1 \alpha^{(t_0)i} + \ldots + E_{t_0-1} \alpha^{2i} + E_{t_0} \alpha^i &= \alpha^i f(e_i)\\
\alpha^{(t_0+2)i} + E_1 \alpha^{(t_0+1)i} + \ldots + E_{t_0-1} \alpha^{3i} + E_{t_0} \alpha^{2i} &= \alpha^{2i} f(e_i)\\
\vdots \quad & \quad \vdots\\
\alpha^{(2t_0-1)i} + E_1 \alpha^{(2t_0-2)i} + \ldots + E_{t_0-1} \alpha^{(t_0)i} + E_{t_0} \alpha^{(t_0-1)i} &= \alpha^{(t_0-1)i} f(e_i)
\end{aligned}$$

Now each equation of the system SE1 is multiplied by the term $\alpha^i e_i$. representing the generical error in amplitude and position is summed in all errors, summing in i. In this manner, each term of the equation of SE1 yields a sum of the type:

$$\sum_{\substack{error i \\ errors}} i e_i \alpha^{(2t_0-j)i} = S_{2t_0-j},$$

that can be recognized as a generic syndrome. Replacing this expression in the equation system SE1 and multiplying by the term $\alpha^i e_i$ and summing according to the index i, the new equation system SE2 is attained:

$$\begin{aligned}
E_{t_0} S_1 + E_{t_0-1} S_2 + \ldots + E_1 S_{t_0} &= S_{t_0+1} + \sum_{error i} i e_i \alpha^i f(e_i) \quad \text{(SE2)}\\
E_{t_0} S_2 + E_{t_0-1} S_3 + \ldots + E_1 S_{t_0+1} &= S_{t_0+2} + \sum_{error i} i e_i \alpha^{2i} f(e_i)\\
E_{t_0} S_3 + E_{t_0-1} S_4 + \ldots + E_1 S_{t_0+2} &= S_{t_0+3} + \sum_{error i} i e_i \alpha^{3i} f(e_i)\\
\vdots \quad &= \vdots\\
E_{t_0} S_{t_0} + E_{t_0-1} S_{t_0+1} + \ldots + E_1 S_{2t_0-1} &= S_{2t_0} + \sum_{error i} i e_i \alpha^{t_0 i} f(e_i).
\end{aligned}$$

Now it can be observed that the coefficient matrix and a part of the right hand side of this equation system SE2 is exactly identical to the right hand side used for determining the coefficients of the location polynomial P1. According to another feature of the invention, the following selection is made:

$$f(e_i) = \frac{1}{\sqrt{e_i}} \quad (F2)$$

Then the generaic term $$\sum_{errori/errors} e_i\alpha^{2ki} = S_{2k},$$

is obtained remembering the property $P(x^2)=P^2(x)$ that is valid in GF(2). Finally the equation system SE3 is obtained:

$$E_{t0}S_1 + E_{t0-1}S_2 + \ldots + E_1S_{t0} = S_{t0+1} + \sqrt{S_2} \quad \text{(SE3)}$$

$$E_{t0}S_2 + E_{t0-1}S_3 + \ldots + E_1S_{t0+1} = S_{t0+2} + \sqrt{S_4}$$

$$E_{t0}S_3 + E_{t0-1}S_4 + \ldots + E_1S_{t0+2} = S_{t0+3} + \sqrt{S_6}$$

$$\ldots \ldots \ldots \ldots = \ldots \ldots$$

$$E_{t0}S_{t0} + E_{t0-1}S_{t0+1} + \ldots + E_1S_{2t0-1} = S_{2t0} + \sqrt{S_{2t0}}$$

Since this equation system SE3 is a linear system the overlapping effect can be applied. Therefore the solutions can be obtained as a sum of two terms, the first arising from the known terms $S_{t0+1}$ with $1 \leq i \leq$ to, the second term arising from the known terms of the type $\sqrt{S_j}$, with $J=2,4,\ldots,2$ to.

Therefore the generic solution can be written as follows:

$$E_i = E_i^* + \delta E_i, \quad 1 \leq i \leq t_0,$$

replacing this solution into the error polynomial Pe, the following equation can be obtained:

$$P_e(x) = x^{t0} + E_1^* x^{t0-1} + \ldots + E_{t0}^* + \delta E_1 x^{t0-1} + \ldots + \delta E_{t0}$$

and, observing that $E_1^*, E_2^*, \ldots, E_{t0}^*$ are exactly the coefficients of the locator polynomial Pl the error polynomial Pe estimated in the error positions $\alpha^i$ supplies:

$$\delta E_1 \alpha^{(t0-1)i} + \delta E_2 \alpha^{(t0-2)i} + \ldots + \delta E_{t0} = \frac{1}{\sqrt{e_i}}. \quad \text{(F3)}$$

Using the algorithm of the invention the amplitudes of errors can be now obtained by simply considering this polynomial Pe, the coefficients therefore are estimated exactly by the same process of the coefficients of locator polynomial Pl, as the sole variation in the classic equation system that allows its calculation is the different column of the right hand side. Contrary to known solutions, the solution according to the invention provides error correction with a better degree of parallelism degree and with a better efficiency.

In fact the known methods require the calculation of the coefficients of the locator polynomial Pl. Then it is possible to establish the error positions, then the coefficients of two polynomials are established depending on the position of the normal error, whose ratio, estimated in the error positions, supplies the amplitudes of the same errors. Now, to the contrary, according to the invention, the coefficients of the location polynomial Pl and of the error polynomial Pe can be contemporaneously estimated and from the first polynomial Pl the position of the current error can be established and, when replaced in the second Pe, supplies advantageously the desired error amplitude.

When the coefficients of the locator polynomial Pl and of the error polynomial Pe are calculated, the Chien's algorithm can be used to establish the real error positions and at the same time the related amplitudes. According to another important feature of the invention, the Chien's search algorithm is modified in such a manner that its hardware implementation is simplified. In particular, instead of considering the classic structure, in which the degree of the locator polynomial Pl depends on the error number really occurred, a polynomial Pl of degree equal to the maximum number of errors that can be corrected by the code. Indicating by $\omega i$, with $i=0, 1, \ldots$, to, $\omega_0 = 1$, the coefficients of the locator polynomial Pl. the resulting polynomial has the critical expression:

$$P_l(x) = \sum_{j=0}^{t0} \omega_{t0-j} x^j. \quad \text{(F4)}$$

Among the further advantages of the invention, it must be underlined the advantage related to the possible extensions of the algorithm that is the object of the invention; in particular the equations (F1), (F2), (F3) can be simply extended to the case of the non-binary BCH codes, Reed Solomon codes with non-binary base field, etc, etc.

Circuit implementation

Figure 4:
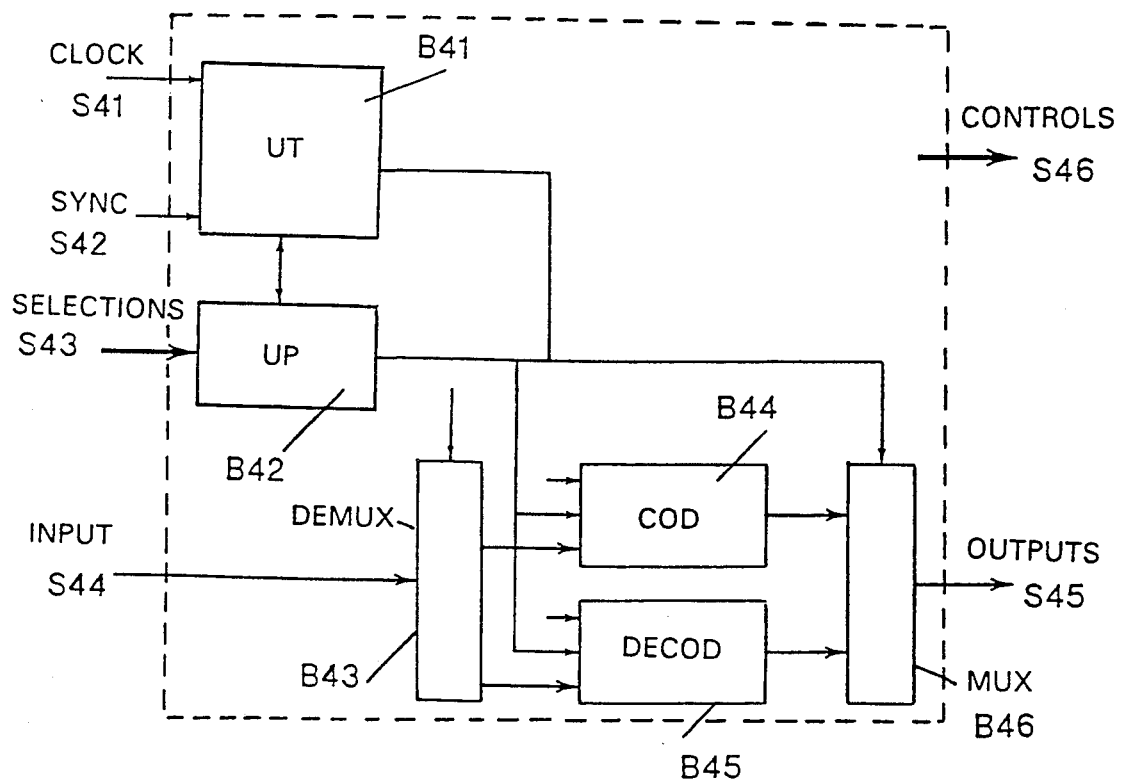
FIG. 4 shows contemporaneous signals and functional blocks of the error correction system of the invention.

According to another preferred and therefore advantageous embodiment of the invention, a sole integrated device includes the encoder COD and the decoder DECOD of the Reed Solomon's code. FIG. 4 shows the devices that form an integrated circuit for the total implementation of the system. FIG. 4 represents contemporaneously signals and functional blocks. More precisely the components can be identified as follows:

S41) CLOCK signal;
S42) SYNC signal that establishes the start of each block of n symbols to be coded or decoded;
S43) SELECTION signals that form a group of external signals by which the device is preset for:
  developing the functions of encoder or decoder,
  processing the symbol blocks having a length until k,
  running or not running with interleaving,
  running or not running in a transparent manner the encoder is disabled in transmission, and the decoder is disabled in reception),
  making or not making the error correction in reception,
  making an autodiagnosis procedure;
S44) input signal;
B41) UT unit for generating the timings of the whole system;
B42) UP management unit for presettings indicated at point S43;
N43) DEMUX units for shunting the input S44 towards the decoder COD in transmission and towards the decoder DECOD in reception;
B44) encoding unit COD according to what described;
B45) decoding unit DECOD according to the invention as described in FIG. 3 and in equations (F1), (F2), (F3), (F4);

B46) MUX unit for selecting the output from the encoder COD in transmission and from the decoder DECOD in reception;

S45) output signals coming from the encoder COD in transmission and from the decoder DECOD in reception;

S46) control signals such e.g.:
block synchronism.
estimation of the frequency of channel errors.
test signals.

To better explain the present invention, an embodiment was described with reference to an implementation represented in the figures. Naturally, the described embodiment can be submitted to modifications, variants, replacements and similar that, being in the reach of the skilled technician, fall naturally within the sprit and scope of the invention.

We claim:

1. A system for error correction in digital transmission using Reed-Solomon encoding/decoding techniques, said system comprising:
   means for receiving coded data signals;
   means for calculating syndromes of $S_i \ldots S_{t+1}$ of said coded data;
   means for establishing coefficients of a locator polynomial;
   means for establishing coefficients of an error polynomial defined by the equation $$P_e(X) = E_0 x^{t0} + \ldots + E_{t0-1} x + E_{t0} = \sum_{i=0}^{t_0} E_i x^{t0-i} \quad (F1)$$

where $P_e(\alpha^i) = f(e_i)$, with $f(e_i)$ being a function of the amplitude error in position i;
   means for constructing a set of t equations for said error polynomial;
   means for multiplying each equation of said set of equations by a predetermined constant representing a generic error in amplitude and position;
   means for summing all terms of each equation of said set of equations multiplied by said predetermined constant to provide a generic syndrome;
   means for substituting said generic syndrome in said set of equations to provide a revised set of t equations forming an error correction output;
   means for modifying said locator polynomial;
   means for determining error positions and related amplitudes by using Chien's algorithm on said modified locator polynomial to provide an error determination output;
   means for multiplexing between said error correction output and a zero output based upon said error determination output to provide an output signal; and
   summing means for combining said coded data signals, delayed in time, with said output signal.

2. A system according to claim 1, wherein said means for calculating the coefficients of the locator polynomial and said means for calculating the error polynomial are in parallel.

3. A system according to claim 2, wherein the means for calculating the error polynomial is located in common with the means for calculating the locator polynomial.

4. A system according to claim 2, wherein the means for calculating the locator polynomial operates according to the equation.

$$P_l(x) = \sum_{i=0}^{t_0} \omega_{(t0-i)} x^i.$$

5. A system according to claim 1, comprising central clock units UT, presetting units UP, coding circuit COD, and/or decoding unit DECOD of Reed-Solomon's type.

6. A method for error correction in digital transmission using the Reed-Solomon encoding/decoding techniques, comprising the steps of:
   receiving coded data signals;
   calculating the syndromes of $S_i \ldots S_{t+1}$ of said coded data signals;
   establishing the coefficients of a locator polynomial;
   establishing the coefficients of an error polynomial defined by the equation $$P_e(x) = E_0 x^{t0} + \ldots + E_{t0-1} x + E_{t0} = \sum_{i=0}^{t_0} E_i x^{t0-i} \quad (F1)$$

where $P_e(\alpha^i) = f(e_i)$, with $f(e_i)$ being a function of the amplitude error in position i;
   constructing a set of t equations for said error polynomial;
   multiplying each equation of said set equations by a predetermined constant representing a generic error in amplitude and position;
   summing all terms of each equation of said set of equations multiplied by said predetermined constant to provide a generic syndrome;
   substituting said generic syndrome in said set of t equations to provide a revised set of t equations to form an error correction output;
   modifying said locator polynomial;
   determining error positions and related amplitudes by using Chien's algorithm on said modified locator polynomial to provide an error determination output;
   multiplexing said error correction output and a zero output based upon said error determination output to provide an output signal; and
   combining said coded data signals with said output signal.

* * * * *